United States Patent [19]

Rhodes

[11] Patent Number: 4,506,259
[45] Date of Patent: Mar. 19, 1985

[54] DIGITAL FAULT MONITOR FOR CONDUCTIVE HEATERS

[75] Inventor: Thomas R. Rhodes, Fremont, Calif.

[73] Assignee: Raychem Corporation, Menlo Park, Calif.

[21] Appl. No.: 324,470

[22] Filed: Nov. 24, 1981

[51] Int. Cl.³ ............................................. G08B 21/00
[52] U.S. Cl. .................................... 340/640; 340/635; 324/62; 219/372; 219/481
[58] Field of Search ............... 340/640, 635, 650, 657; 324/51, 62; 361/274, 275; 219/322, 363, 481

[56] References Cited

U.S. PATENT DOCUMENTS

| | | | |
|---|---|---|---|
| 3,657,602 | 4/1972 | Boehm et al. | 340/635 |
| 3,906,341 | 9/1975 | Getz et al. | 340/640 |
| 4,292,499 | 9/1981 | Kleinschmidt et al. | 340/640 |

Primary Examiner—Gerald L. Brigance
Attorney, Agent, or Firm—Timothy H. P. Richardson

[57] ABSTRACT

The present invention is directed to a device for detecting faults in an electrically-conductive heating element and more specifically concerns a digital monitor which compares internal electrical noise produced by the electrically-conductive heating element with external electrical noise produced by the heating element power source in order to determine whether faults exist in the heating element.

19 Claims, 5 Drawing Figures

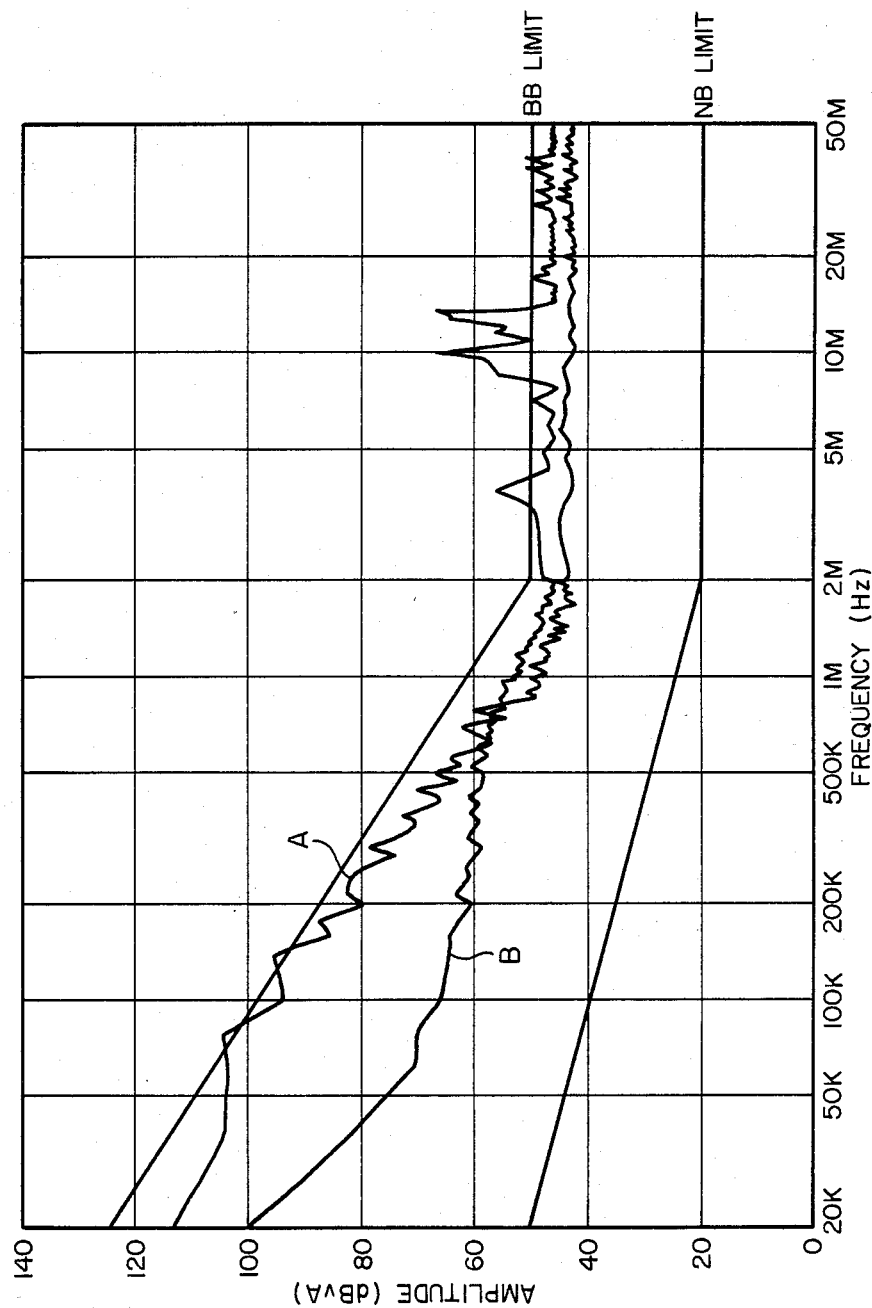
FIG_1

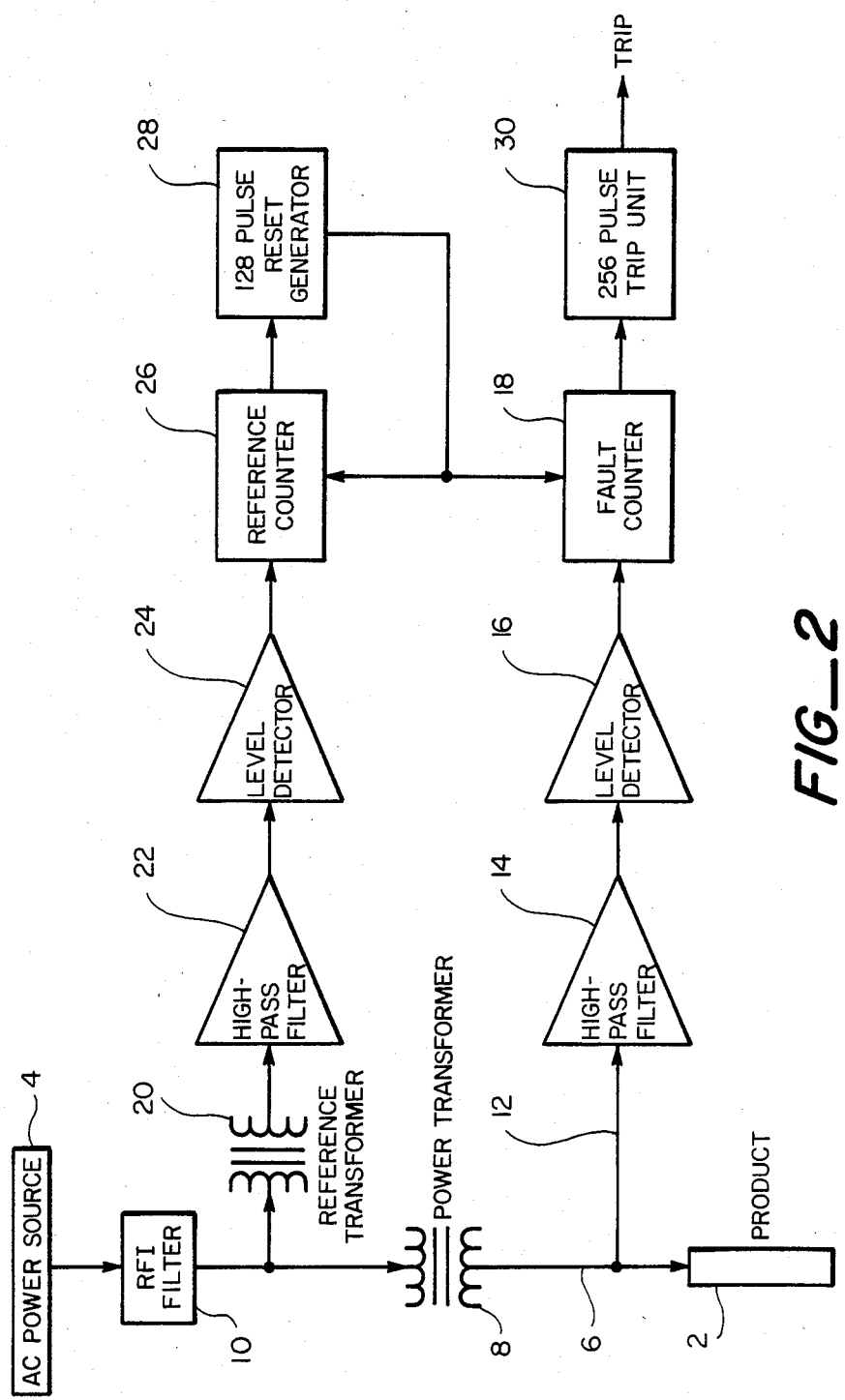
FIG_2

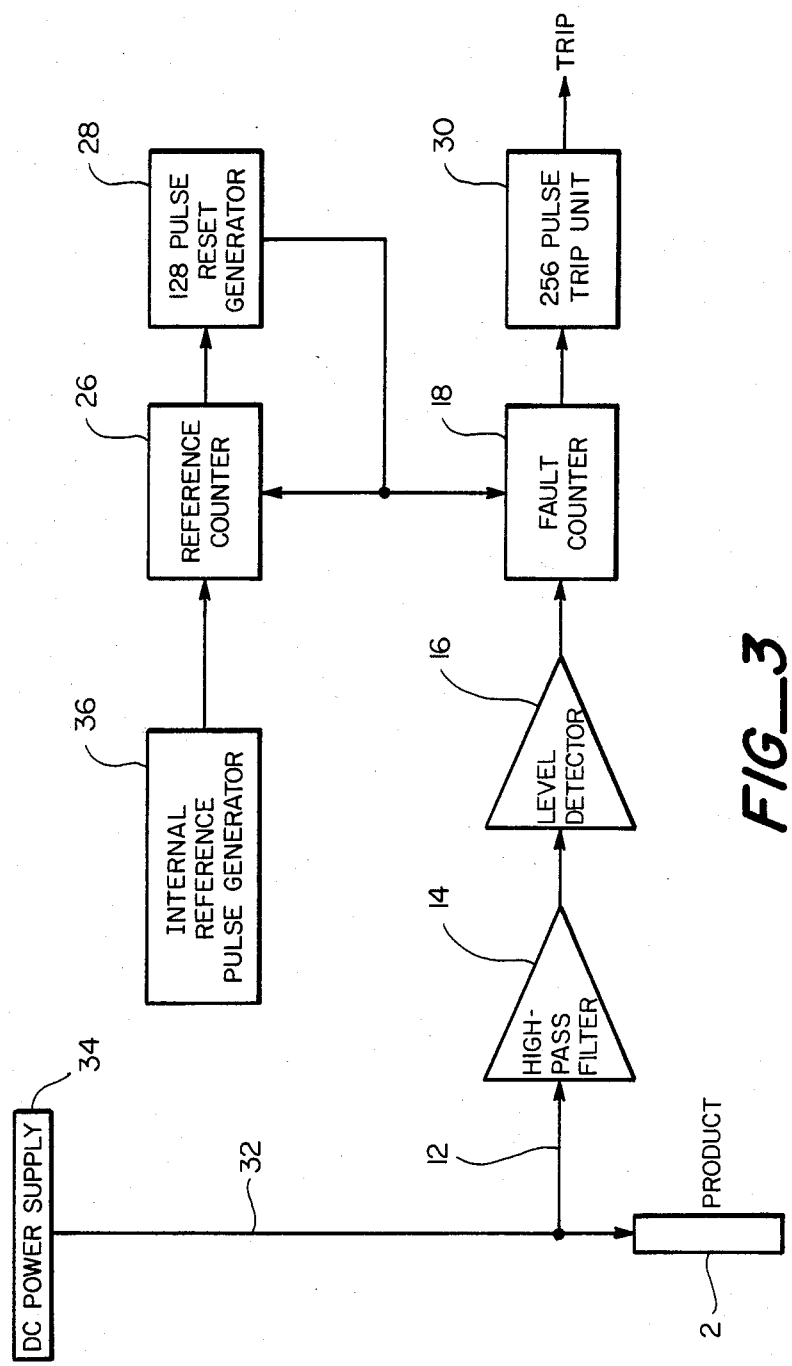
FIG_3

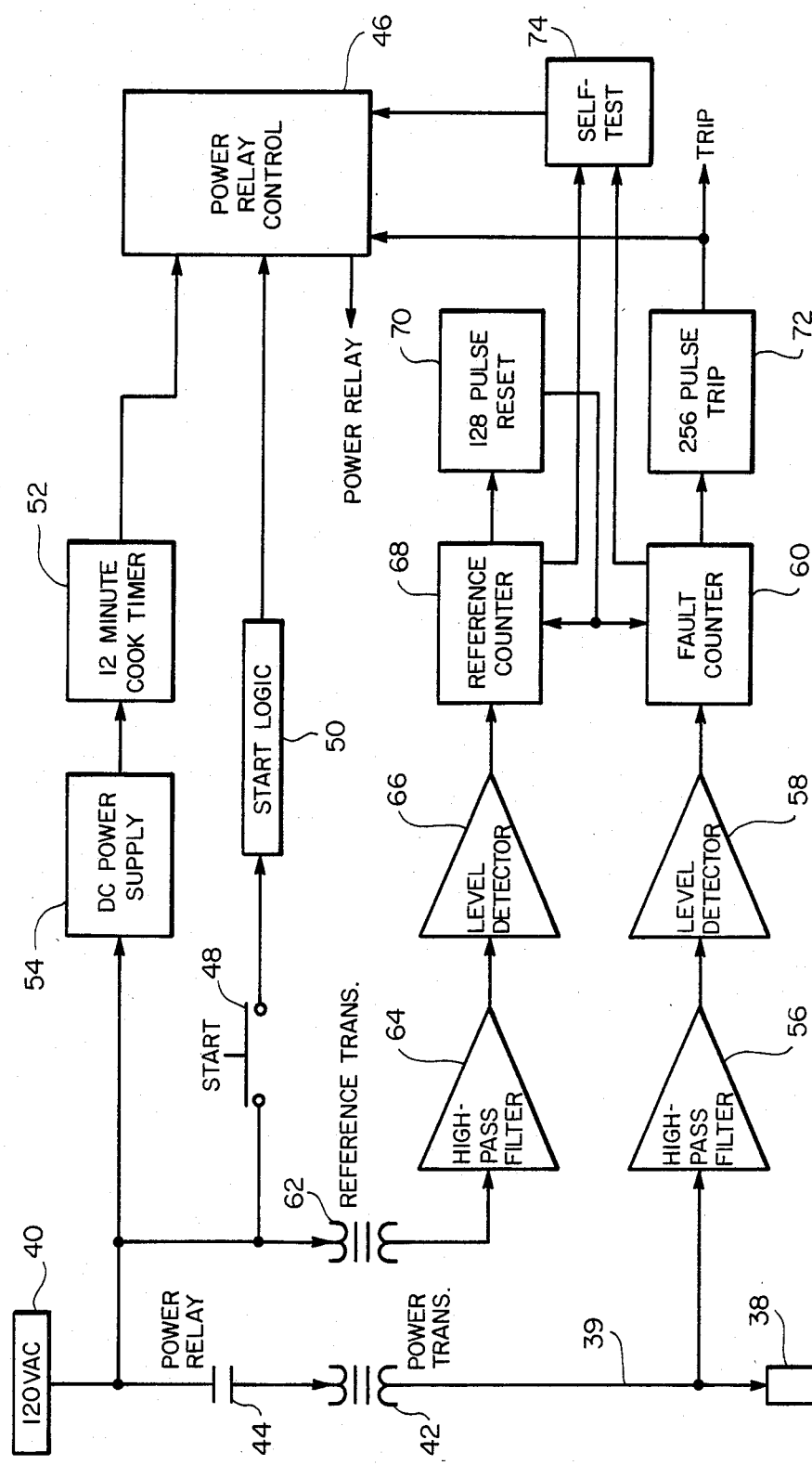
FIG_4

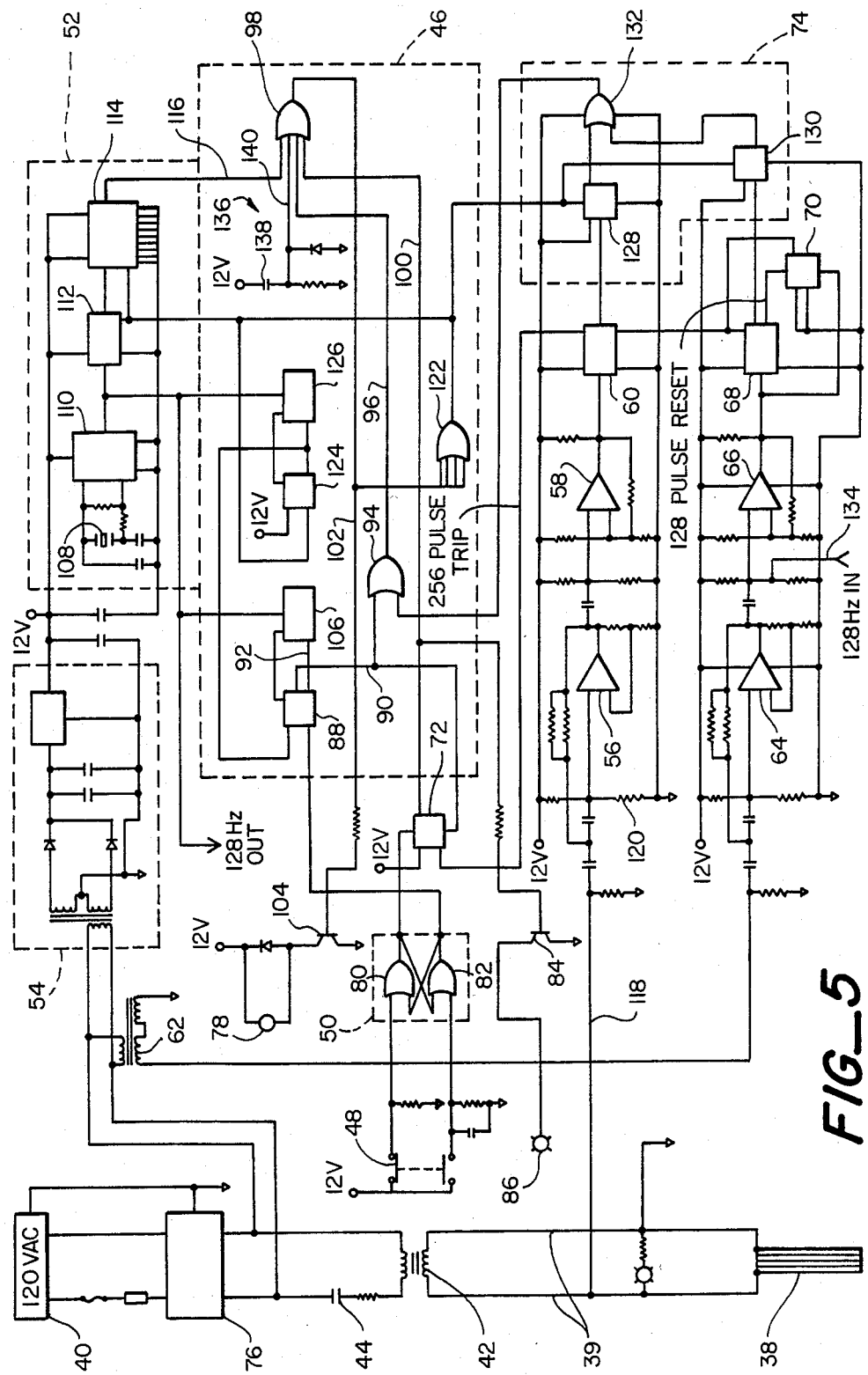
FIG_5

DIGITAL FAULT MONITOR FOR CONDUCTIVE HEATERS

BACKGROUND ART

In recent years, conductive materials with positive temperature coefficients of resistance have been utilized in constructing a wide variety of self- or auto-regulated heating elements. The distinguishing characteristic associated with such conductive materials, known as PTC materials, is the substantial increase in resistance to conductivity which occurs as the material attains a certain temperature. This temperature (or temperature range, as the case may be) is usually designated the switching or anamoly temperature $T_s$. Beyond the anamoly temperature $T_s$, resistance in the material can become so high that any current flow through the material is effectively switched off. In practical terms, then, the anamoly temperature $T_s$ represents the maximum temperature obtainable by a PTC material in response to current flow therethrough, and heating elements constructed from PTC material consequently exhibit inherent self-regulation with respect to temperature.

Numerous PTC materials are ceramic in composition. Others may comprise conductive polymers of the type disclosed in U.S. Pat. No. 4,017,715 issued to Whitney et al on Apr. 12, 1977; U.S. Pat. No. 4,177,376 issued to Horsma et al on Dec. 4, 1979; and U.S. Pat. No. 4,177,446 issued to Diaz on Dec. 4, 1979. Despite the generally satisfactory performance of the PTC materials developed to date, however, some problems remain. Electrical faults, for example, can develop in either the heating circuit electrical connectors or in the PTC material itself, leading to excessive power dissipation and attendant catastrophic material failure accompanied by fire. Some means for monitoring the operation of conductive PTC heating elements in order to determine whether potentially dangerous faults are present would accordingly be of obvious benefit.

DISCLOSURE OF THE INVENTION

It is therefore an object of the present invention to provide a monitoring means for use with electrically-conductive elements.

It is another object of the present invention to provide a monitoring device capable of detecting fault conditions in an electrically-conductive element.

It is yet another object of the present invention to provide a device which detects and digitally analyzes the noise spectrum produced by an electrically-conductive element in order to determine whether the electrically-conductive element is faulting.

It is still another object of the present invention to provide a monitoring device for use with an electrically-conductive element fabricated from PTC material wherein the monitoring device digitally compares the noise generated by the electrically-conductive element with noise generated by the power source supplying the operating current to the electrically-conductive element, the digital comparison subsequently serving as a basis for determining whether the PTC material is faulting.

These and other objects of the present invention are achieved in a monitoring device which includes a fault level detector connected to receive internal noise produced by an electrically-conductive element. The fault level detector is adjusted to provide an output pulse whenever the internal noise exceeds a predetermined voltage level. If desired, a filtering means may be employed to limit the noise reaching the fault level detector to a predetermined frequency band of interest. Where operating current for the electrically-conductive element is supplied by a DC power source, a reference generator establishes a fixed frequency pulse train for use as a reference signal against which the output of the fault level detector can be compared. Counters respectively count the pulses in the fixed frequency pulse train and the level detector output. A logic network processes the output of the counters such that a TRIP signal indicative of fault conditions is generated whenever the count of the fault level detector output during a given interval exceeds the count of the pulses in the fixed frequency pulse train by more than a predetermined amount. Where the operating current for the electrically-conductive element is supplied by an AC power source, a second or reference level detector coupled to the power source through a reference transformer is used to derive the reference signal as a function of external or background noise produced by the power source. The power source is isolated from the electrically-conductive element to prevent internal noise produced by the electrically-conductive element from reaching the reference level detector. Respective counts of the number of noise excursions beyond the predetermined decibel levels set into both the fault level detector and the reference level detector are again taken, with the logic network again processing the counter outputs to generate a TRIP signal whenever the count of the fault level detector output during the given interval exceeds the count of the reference level detector output by more than a predetermined amount.

BRIEF DESCRIPTION OF THE DRAWINGS

The various objects, features and advantages of the present invention will be better understood by considering the following Brief Description Of The Drawings in conjunction with the Best Mode For Carrying Out The Invention, wherein:

FIG. 1 graphically represents both the frequency spectrum of noise produced by a conventional AC power source and the frequency spectrum of noise typically produced as a result of fault conditions occurring in an electrically-conductive element fabricated from PTC material;

FIG. 2 schematically illustrates a monitoring device for use in detecting faults which occur in an AC powered electrically-conductive element;

FIG. 3 schematically illustrates a monitoring device capable of detecting faults which occur in a DC powered electrically-conductive element;

FIG. 4 schematically illustrates a digital power supply and monitoring device for use with an electrically-conductive element fabricated from PTC material; and FIG. 5 is a detailed circuit diagram of the digital power supply and monitoring device illustrated in FIG. 4.

BEST MODE FOR CARRYING OUT THE INVENTION

Failure in an electrically-conductive element can be traced to any of several fault conditions. Perhaps the simplest failure mode of the electrically-conductive element involves an oversupply of heat. In particular, if the electrically-conductive element is for some reason generating more resistive heat than the surrounding environment can absorb, temperatures in the electrically-conductive element can become high enough to permanently damage the element. Element burn-out in a waterbed heater following exposure of the heater to the open atmosphere is an example of this type of failure. Another failure mode can be attributed to material defects in the metallic electrodes or power conductors interconnecting the electrically-conductive element with a source of operating power. The material defects produce high resistance arcing or sparking in the power conductors when power is applied to the element, again leading to potentially dangerous increases in temperature at the site of the arcing and ultimate catastrophic element failure.

Finally, where the electrically-conductive element is fabricated from PTC material, the PTC material itself can fault. Such faulting occurs when minute conductive paths in the PTC material break down and begin to dissipate excessive energy. These minute conductive paths burn out and new conductive paths close to the burned-out paths are thereafter established. The new conductive paths carry increased current loads and may additionally exhibit increased resistances. Corresponding increases in the amount of heat generated at the site of the new conductive paths lead to further burn-outs, with attendant increases in local temperatures. If left unchecked, i.e., if current flow through the PTC material is not cut off, the local temperatures can increase to a level sufficient for sustaining a flame. At this point, catastrophic material failure will occur and fire generally results.

A suitable solution to the problem of detecting faults in an electrically-conductive element before the failure of the electrically-conductive element reaches catastrophic proportions can be found by analyzing the frequency spectrum of electrical noise present in the power conductor interconnecting the power source with the element. It has been observed that the noise present in the power conductor contains at least two components. The first component is the external or background noise produced by the power source generator. The second component, which only appears during an ongoing fault condition attributable to excessive heat generation, power conductor arcing, PTC material failure or the like, is produced as a direct result of the fault condition. The external or background noise associated with the power source is primarily intermittent in nature, although the noise amplitude may reach relatively large magnitudes. In contrast, the fault-induced internal noise is characterized by continuous high frequencies and low amplitudes. Thus, an indication of the occurrence of fault conditions in the electrically-conductive element can be obtained by carefully distinguishing between the external and internal noise components present in the power conductor.

The fact that internal noise produced by fault conditions in an electrically-conductive element tends toward high frequency, low amplitude signal while the external or background noise produced by the power source tends to an intermittent, high amplitude signal suggests a digital rather than an analog approach to constructing a means for detecting the fault conditions. Because the amplitude of the external noise exceeds the amplitude of the fault-induced internal noise, attempts at distinguishing between the two noise signals by using analog integration techniques to measure noise signal power content will be inadequate. The total power content in a relatively few high amplitude external noise excursions may well exceed the total power content of numerous low amplitude internal noise excursions. Employing digital techniques to effectively measure noise signal zero crossings, on the other hand, does provide an adequate basis for separating the high frequency internal noise component from the low frequency external noise component. All that remains is the determination of an appropriate frequency range within which the frequency spectrum analysis should be performed. In this regard, curve A of FIG. 1 graphically depicts the frequency spectrum of internal electrical noise typically produced by an electrically-conductive element fabricated from PTC material, wherein the PTC material is faulting but the failure of the minute conductive paths described above has not yet created the conditions necessary to sustain a flame. The external noise frequency spectrum associated with a power source conventionally employed to provide operating current for the heating element is indicated at B. As is evident from FIG. 1, the fault-induced internal noise is broadband in nature with numerous significant peaks in the range from 20 KHz to 500 KHz. It can also be seen that significant internal noise activity, as opposed to external noise activity, is present below frequencies of 160 KHz. The frequency range of interest for purposes of distinguishing between internal and external noise can accordingly be set from, say, 30 KHz to 160 KHz. This latter frequency range has the added advantage of preventing conventional power conductor harmonics from interfering with the detection or distinguishing process.

FIG. 2 is a block diagram of a device for detecting faults in electrically-conductive elements; the FIG. 2 device utilizes a digital method for distinguishing between external noise produced by the element power source and fault-induced internal noise produced in the element itself. The electrically-conductive element, indicated at 2, is connected to an alternating current power source 4 via power conductor 6. A power transformer 8 serves to adjust voltage from the alternating current power source 4 to a level suitable for use by the electrically-conductive element 2. A passive line filter 10 is connected between power transformer 8 and alternating current power source 4. A feedback lead 12 supplies a high-pass filter 14 with a signal representing the voltage appearing across electrically-conductive element 2. High-pass filter 14 is responsive to the frequency range of interest, for example, between 30 KHz and 160 KHz. A fault level detector 16 is connected to high-pass filter 14 in a manner such that a high frequency internal noise excursion appearing in the voltage supplied to high-pass filter 14, which internal noise excursion exceeds the preset threshold of fault level detector 16, causes the fault level detector to generate an output or fault pulse. The fault pulse from fault level detector 16 in turn advances a fault counter 18 to provide a measure of the number of fault pulses generated during a given time interval. In a similar manner, external or background noise on power conductor 6 is coupled across a reference transformer 20, filtered in high-pass reference filter 22 and detected by reference level detector 24, whereupon the reference level detector outputs reference pulses which advance reference counter 26 to provide a measure of the number of external noise excursions occurring in the power conductor during the given time interval. The isolation necessary to prevent internal noise produced by the electrically-conductive element 2 from affecting the operation of the reference filter, reference level detector and reference counter is furnished by passive line filter 10 and power transformer 8.

When the count in reference counter 26 reaches a predetermined reference value, reset latch 28 generates a RESET pulse which resets both reference counter 26 and fault counter 18 to zero. If no faulting has occurred in electrically-conductive element 2 during the interval required for the reference counter to reach the predetermined reference value, the internal noise from the electrically-conductive element will consist almost entirely of background noise and the count registered in fault counter 18 will approximate the count registered in reference counter 26. If fault conditions do exist in electrically-conductive element 2, however, the presence of internal noise excursions associated with the fault conditions will result in the generation of additional fault pulses from fault level detector 16 during the interval required for the reference counter to reach the predetermined reference value. The count registered in fault counter 18 as a result of the fault conditions will accordingly exceed the count registered in reference counter 26. If the count in fault counter 18 reaches a predetermined trip value before the count in reference counter 26 reaches the predetermined reference value, a trip latch 30 connected to fault counter 18 generates a TRIP signal which is thereafter used to disconnect electrically-conductive element 2 from the alternating current power source 4. The TRIP signal may also act to energize an audio or visual alarm, providing a warning of the existence of fault conditions in the electrically-conductive element. The predetermined trip value may, if desired, be greater than the predetermined reference value by a factor of two. Such a feature doubles the number of fault pulses relative to reference pulses necessary to produce a TRIP signal, increasing the immunity of the detecting circuitry to random or spurious trips otherwise caused by the connection of electrically noisy devices such as motors, fans or drills to the alternating current power source.

When electrically-conductive element 2 receives operating power from a direct current power source, as opposed to the alternating current power source 4 of FIG. 2 generally low or non-existent external noise conditions in the DC power conductor 32 interconnecting the direct current power source with the electrically-conductive element are assumed. It then becomes necessary to generate an internal reference against which internal noise excursions produced by the electrically-conductive element can be compared. FIG. 3 illustrates a detector circuit suitably modified for use with a direct current power source 34, wherein an internal reference pulse generator 36 is utilized to supply reference pulses for advancing the count in reference counter 26. High-pass filter 14 and fault level detector 16 are connected via lead 12 to DC power conductor 32 such that fault level detector 16 again produces fault pulses which advance fault counter 18 in response to internal noise excursions exceeding the fault level detector threshold. As in the FIG. 2 embodiment, the count from reference counter 26 is compared to the count from fault counter 18 by means of reset latch 28, and trip latch 30 is triggered to provide the TRIP signal whenever the count from fault counter 18 reaches the predetermined trip value before the count in reference counter 26 reaches the predetermined reference value.

FIG. 4 shows a block diagram of a digital power supply and monitoring circuit designed to furnish an electrically-conductive heating element 38 with operating current. Electrically-conductive heating element 38 may be fabricated from PTC material, and may in particular be constructed from a polymer PTC material of the type illustrated in the aforementioned Whitney et al, Horsma et al or Diaz patents, the disclosures of which are incorporated herein by reference. A power conductor 39 connects electrically-conductive element 38 to an alternating current power source 40. Power source 40 may comprise a filtered 120 volt AC line power supply. Power transformer 42 interposed in power conductor 39 provides an appropriate voltage conversion for the electrically-conductive heating element. A power relay 44 also interposed in power conductor 38 between power transformer 42 and power supply 40 serves to disconnect operating current from the electrically-conductive heating element at either the end of a precisely-defined heating interval or upon the occurrence of fault conditions. A power relay control circuit 46 governs the operation at power relay 44. When heat from the electrically-conductive heating element 38 is desired, start button 48 is depressed to activate start logic 50. Start logic 50 signals power relay control circuit 46 to close power relay 44, and operating current begins flowing from power source 40 through power transformer 42 to the electrically-conductive heating element. Thereafter, as described more fully in the aforementioned Whitney et al, Horsma et al and Diaz patents, electrically-conductive heating element 38 generates heat in response to the operating current flow. Assuming that no fault conditions are present in electrically-conductive heating element 38, power relay 44 remains closed for a heating interval defined by timer 52 and the electrically-conductive heating element continues to generate heat. At the end of the defined heating interval, timer 52 generates a control signal which causes power relay control circuit 46 to open power relay 44, disconnecting power source 40 from electrically-conductive heating element 38. A DC power supply 54 taps the AC power source 40 to furnish operating voltage for timer 52. DC power supply 54 additionally provides operating voltage for various other components in the digital power supply and monitoring circuit.

The digital power supply and monitoring circuit of FIG. 4 also includes a high-pass filter 56, fault level detector 58 and fault counter 60 which function in a manner analogous to that of high-pass filter 14, fault level detector 16 and fault counter 18 of FIG. 2, producing a fault count indicative of the occurrence of fault conditions in electrically-conductive heating element 38. Reference transformer 62, high-pass filter 64, reference level detector 66 and reference counter 68 likewise perform in a manner functionally analogous to the reference transformer 20, high-pass filter 22, reference level detector 24 and reference counter 26 of FIG. 2, generating a reference count indicative of the external noise present on power conductor 38. Reference counter 68 acts to trigger reset latch 70 when the number of reference pulses leaving reference level detector 66 reaches the predetermined reference value, while fault counter 60 drives trip latch 72 to generate a TRIP signal when the number of fault pulses output from fault level detector 58 reaches the predetermined trip value. It will be recalled, of course, that the TRIP signal from trip latch 72 only appears if fault counter 60 reaches the predetermined trip value before reference counter 68 reaches the predetermined reference value. The TRIP signal activates power relay control circuit 46 to open power relay 44 and cut off the flow of current through power conductor 39 to electrically-conductive heating element 38. A test circuit 74 connected to both fault counter 60 and reference counter 68 verifies the operation of the high-pass filters, the reference and fault level detectors and the reference and fault counters when START button 48 is depressed.

FIG. 5 is a detailed circuit diagram of the digital power supply and monitoring device schematically illustrated in FIG. 4. As previously indicated, electrically-conductive heating element 38 may be fabricated from a conductive polymer having PTC characteristics. Operating current is applied to the electrically-conductive heating element 38 via power conductor 39, which power conductor is supplied with appropriate voltage from a power transformer 42 connected via passive line filter 76 to an external power source 40 such as a 120 volt AC line power supply. Power relay 44 is connected to the primary of power transformer 42. The power relay passes current to the power transformer, and hence the electrically-conductive heating element 38, in response to energization of relay solenoid 78. The heating sequence is initiated by depressing START button 48. NOR gate 80 in start logic 50 consequently switches high while NOR gate 82 in the start logic switches low. The high output from NOR gate 80 sets trip latch 72, which trip latch may comprise a D flip-flop. The Q output of the trip latch is thus driven high to activate transistor 84, in turn drawing power through FAULT INDICATOR light 86. When the FAULT INDICATOR light flashes, indicating that the trip latch is functioning properly, START button 48 is released. The output of NOR gate 80 switches to a low value, removing the set from trip latch 72. NOR gate 82 simultaneously switches high to clock flip-flop 88 in power relay control circuit 46, generating both a high Q output or START signal on lead 90 and a low $\bar{Q}$ output on lead 92. The high Q output or START signal thereafter resets trip latch 72 while switching the output of NOR gate 94 low, the latter event serving to supply a low input along lead 96 to quad-input NOR gate 98. The Q output of trip latch 72 returns to a low value, deactivating transistor 84 and turning off FAULT INDICATOR light 86. The low Q output from trip latch 72 is also supplied along lead 100 to quad-input NOR gate 98. Assuming for the moment that the remaining inputs to NOR gate 98 are low, the output of NOR gate 98 will switch high to provide a POWER RELAY signal on lead 102. Transistor 104 is accordingly activated to apply operating voltage across relay solenoid 78, closing power relay 44 to complete the circuit connection between power source 40 and electrically-conductive heating element 38. Meanwhile, the low $\bar{Q}$ output generated on lead 90 by flip-flop 88 removes the reset from binary counter 106. Binary counter 106 is subsequently clocked by a 128 Hz signal received from timer 52 until the $Q_5$ output of counter 106 switches high to reset flip-flop 88. The Q output or START signal from flip-flop 88 then switches low, removing the reset from trip latch 72 and enabling NOR gate 90. Upon reflection, it can be seen that the duration of the START signal is 0.125 seconds, i.e., the interval defined by the clocking of counter 106 to the $Q_5$ stage. During this interval, if the output from test circuit 74, the operation of which is described in detail hereinbelow, switches high to verify the functioning of the various reference and fault filters, level detectors and counters, the output of NOR gate 90 remains low. The corresponding output of NOR gate 98 thus remains high, keeping power relay 44 closed to continue the flow of operating current through electrically-conductive heating element 38.

The amount of heat generated by electrically-conductive heating element 38 in response to the flow of operating current therethrough is established in accordance with the autoregulating character of the PTC material comprising the heating element and the length of the heating interval as defined by timer 52. Timer 52 includes a crystal oscillator 108 arranged to drive cascade-connected divide-by-two counter 110, binary counter 112 and shift register 114. Counter 110 in particular outputs a 128 Hz signal which, in addition to clocking counter 112, supplies the clock input of binary counter 106 in power control relay circuit 46. The extent of the heating interval is determined through suitable adjustment of the oscillator, counter and shift register parameters. Operating current is supplied to the electrically-conductive heating element throughout the heating interval, unless, of course, some fault condition in the electrically-conductive heating element arises to cut short the heating sequence. At the end of the heating interval, shift register 114 outputs a high signal on lead 116, driving the output of NOR gate 98 low to deactivate transistor 104 and remove operating voltage from solenoid 78. Power relay 44 then opens, removing operating current from the electrically-conductive heating element and terminating the heating sequence.

Fault conditions in electrically-conductive heating element 38 are detected in the manner previously described. That is, internal electrical noise produced by electrically-conductive heating element 38 is removed from power conductor 39 via lead 118 and supplied to the input of active high-pass filter 56. High-pass filter 56 may be a two-pole operational amplifier energized by a single rail power supply, in which case resistors 120 are necessary to bias the operational amplifier up off ground. High-pass filter 56 is also centered at approximately 30 KHz with an active range between 30 KHz and 160 KHz. Threshold filter response will be approximately three decibels. The output of filter 56 is tied to fault level detector 58. Fault level detector 58 thus provides an output or fault pulse whenever internal noise excursions in the frequency band of interest defined by filter 56 exceed a predetermined or threshold level. The output from fault level detector 58 clocks a fault counter 60 such as a National Semiconductor CD 4020 ripple-carry binary counter. The $Q_9$ output of the fault counter, which switches high after two hundred and fifty six fault pulses have been received, is tied to the clock input of trip latch 72. External or background noise produced by the power source 40 is coupled across reference transformer 62 to high-pass filter 64 and reference level detector 66. Interference between internal noise produced by the electrically-conductive heating element 38 and the external noise detected in the reference level detector is prevented by the isolating effect of passive line filter 76 and power transformer 42. High-pass filter 64 and reference level detector 66 are structurally and functionally identical to high-pass filter 56 and fault level detector 58. Accordingly, external noise excursions from power source 40 which fall within the aforementioned 30 KHz-160 KHz frequency range and have a power content at least equal to the threshold level of reference level detector 66 produce output pulses at the clock input of reference counter 68. The $Q_8$ output of the reference counter drives the set pin of reset latch 70. Reset latch 70 may comprise a D flip-flop, with the Q output thereof tied to the reset pin of both counters 60 and 68. Under no-fault conditions, the generation of one hundred and twenty eight output or reference pulses by reference level detector 66 will operate to switch the $Q_8$ output of reference counter 68 high, resetting the fault and reference counters and reinitiating the comparison between internal noise produced by electrically-conductive heating element 38 and external noise produced by power source 40. Where, however, a fault condition in the electrically-conductive heating element has resulted in the generation of two hundred fifty six fault pulses from fault level detector 58 before one hundred and twenty eight reference pulses can be generated by reference level detector 66, fault counter 60 will clock trip latch 72 to drive the trip latch Q output high, activating transistor 84 and energizing FAULT INDICATOR light 86 while simultaneously driving the output of quad-input NOR gate 98 low. The low output from NOR gate 98 deactivates transistor 104 to cut off power to solenoid coil 78 and open the power contacts (not shown) in the power relay 44.

The output of NOR gate 122 in power relay control circuit 46 is also driven high by the fault-induced low output from NOR gate 98, clocking flip-flop 124 to switch the flip-flop $\overline{Q}$ output low. The data input to flip-flop 88 and the reset to counter 126 are both removed, preventing the flip-flop from generating a START pulse until the $Q_9$ output of counter 126 is clocked high to reset flip-flop 124. Note that counter 126 is connected to receive clock pulses from the 128 Hz signal generated by counter 110 of timer 52. A two second interval will pass before the $Q_9$ output of counter 126 resets flip-flop 124 and restores the data input to flip-flop 88, thereby enabling the flip-flop to produce a high Q output or START signal in response to the release of START button 48. As a net result, electrically-conductive heating element 38 cannot be reconnected to power source 40 for at least two seconds following the appearance of a fault indication which opens power relay 44.

Test circuit 74 comprises a pair of D flip-flops 128 and 130 respectively connected to the $Q_4$ outputs of fault counter 60 and reference counter 68. The $\overline{Q}$ outputs of flip-flops 128 and 130 are connected to the inputs of NOR gate 132. The low output from NOR gate 98 which appears when START button 48 is first depressed to initiate the heating sequence drives the output of NOR gate 122 high, resetting both flip-flop 128 and flip-flop 130. Thereafter, during the interval in which the START signal appears on lead 90, some external noise should be present in power conductor 39 and both fault level detector 58 and reference level detector 66 should operate to produce output pulses as a function of this external noise. If at least eight such pulses have clocked fault counter 60 and reference counter 68 prior to the end of the START signal, flip-flops 128 and 130 will also be clocked to produce respective low $\overline{Q}$ outputs, locking the output of NOR gate 132 high. In this manner, the output of NOR gate 94 remains low following the termination of the START signal, and the power relay output of NOR gate 98 remains high to keep transistor 104 and relay solenoid 78 energized. If, on the other hand, some malfunction in the FIG. 5 circuitry has prevented either reference counter 66 or fault counter 58 from counting the eight pulses, the associated flip-flop 128 or 130 will not clock and the $\overline{Q}$ output thereof will remain high to disable NOR gate 130, causing the output of NOR gate 94 to switch high at the end of the START signal. NOR gate 98 will then output a low power relay signal to turn off transistor 104 and deenergize relay solenoid 78, opening power relay 44 to prevent operating current from reaching electrically-conductive heating element 38. Power source 40 cannot be reconnected to the electrically-conductive heating element for at least another two second interval, as determined by the operation of flip-flop 124 and counter 126. At the end of the two second interval, depressing and releasing the START button 48 will restart the heating sequence and, assuming that the conditions which produced the low output from NOR gate 132 have been removed, power relay 44 will remain closed following the termination of the new START pulse.

Where the digital power supply and monitoring device of FIG. 5 is employed with a DC power source such as DC power source 32 of FIG. 3, reference transformer 62 can be disconnected from the power conductor connecting the power source with the electrically-conductive heating element. As indicated at 134 in FIG. 5, the 128 Hz signal generated by counter 110 is then connected to the input of the reference level detector 66 and used to establish a reference count in reference counter 68.

A power-up reset circuit 136 may be added to power relay control circuit 46 in order to prevent the power relay 44 from erroneously closing immediately after the digital power supply and monitoring device of FIG. 5 is first turned on. The power-up process occurring in DC power supply 54 as the digital power supply and monitoring device is connected to power conductor 38 generates a false clock input to flip-flop 88 when NOR gate 82 is energized. This false clock input causes the flip-flop to generate a false START signal, which false START signal would otherwise produce a low output from NOR gate 98 to turn on transistor 104 and energize relay solenoid 78. The false START signal is prevented from closing relay contacts 44 by the presence of power-up reset circuit 136. Power-up reset circuit 136 includes a capacitor 138 capable of holding input 140 to NOR gate 98 high until DC power supply 54 reaches operating potential, at which point the capacitor charges to a level sufficient to lower the voltage on input 140 and control over the output status of NOR gate 98 is returned to leads 96, 100 and 116. START button 48 may thereafter be depressed in a normal fashion to initiate the heating sequences of the digital power supply and monitoring device.

The present invention has been set forth in the form of several preferred embodiments. It is nevertheless understood that modifications to the circuit configurations disclosed herein may be made by those skilled in the art without departing from the spirit and scope of the present invention. Moreover, such modifications are considered to be within the purview of the appended claims.

What is claimed is:

1. Apparatus for detecting a fault condition in an electrically conductive device while it is being powered by an AC power supply, said apparatus comprising
    (1) means for connecting the apparatus to the AC power supply;
    (2) means for connecting the apparatus to the device; and
    (3) a comparator which, when the apparatus is connected to the AC power supply and to the device, (a) counts, over successive time periods of predetermined duration, the number of times that electrical noise in the power supply exceeds a predetermined level and the number of times that the electrical noise in the device exceeds said predetermined level, and (b) indicates when, in any given time period, the counted number of times that the noise in the device exceeds said predetermined level is greater, by at least a predetermined number, than noise in the power source exceeds said predetermined level.

2. Apparatus according to claim 1, which comprises a switch for disconnecting the device from the power supply when the difference between the counted numbers is at least said predetermined number.

3. Apparatus according to claim 1, which comprises a first filter which permits only noise in the power supply having predetermined frequency characteristics to reach the comparator; and a second filter which permits only noise in the device also having said predetermined frequency characteristics to reach the comparator.

4. Apparatus according to claim 3, wherein each of said first and second filters is a band pass filter having a lower pass level of at least 30 KHz and an upper pass level of at most 160 KHz.

5. Apparatus for detecting a fault condition in an electrically conductive device while it is being powered by a DC power supply, said apparatus comprising (1) means for connecting the apparatus to the device;

(2) a reference signal generator which can generate a reference signal having a predetermined frequency pulse train when the apparatus is connected to the device; and (3) a comparator which, when the apparatus is connected to the device, and the device is connected to the DC power supply, (a) counts, over successive time periods of predetermined duration, the number of times that the electrical noise in the device exceeds a predetermined level, and (b) indicates when, in any given time period, the counted number is greater, by at least a predetermined number, than the number of pulses in the reference signal.

6. Apparatus according to claim 5, which comprises a switch for disconnecting the device from the power supply when the counted number is greater, by at least the predetermined number, than the number of pulses in the reference signal.

7. Apparatus according to claim 5, which comprises a filter which permits only noise in the device having predetermined frequency characteristics to reach the comparator.

8. Apparatus according to claim 7, wherein the filter is a band pass filter having a lower pass level of at least 30 KHz and an upper pass level of at most 160 KHz.

9. A method for monitoring an electrically conductive device to determine when a fault condition has occurred in said device, which method comprises (1) passing AC current from an AC power supply through the device;

(2) counting, over successive time periods of predetermined duration, the number of times that electrical noise in the power supply exceeds a predetermined level and the number of times that electrical noise in the device exceeds said predetermined level; and (3) indicating when, in any given time period, the counted number of times that the noise in the device exceeds said predetermined level is greater, by at least a predetermined number, than the counted number of times that the noise in the power source exceeds said predetermined level.

10. A method according to claim 9, wherein step (4) comprises disconnecting the device from the power supply.

11. A method according to claim 9, wherein the device is a conductive polymer heater.

12. A method according to claim 11, wherein the heater is a self-regulating heater comprising a PTC conductive polymer.

13. A method according to claim 9, wherein in step (2) only electrical noise having a frequency in a predetermined frequency band is examined.

14. A method according to claim 13, wherein said frequency band has a lower limit of at least 30 KHz and an upper limit of at most 160 KHz.

15. A method for monitoring an electrically conductive device to determine when a fault condition has occurred in said device, which method comprises (1) passing DC current from a DC power supply through the device;

(2) generating a reference signal having a predetermined frequency pulse train;

(3) counting over successive time periods of predetermined duration, the number of times that electrical noise in the device exceeds a predetermined level;

(4) indicating when, in any given time, the counted number is greater, by at least a predetermined number, than the number of pulses in the reference signal.

16. A method according to claim 15, wherein step (4) comprises disconnecting the device from the power supply.

17. A method according to claim 15, wherein the device is a conductive polymer heater.

18. A method according to claim 17, wherein the heater is a self-regulating heater comprising a PTC conductive polymer.

19. A method according to claim 15, wherein in step (3) only electrical noise having a frequency in a predetermined frequency band is examined.

* * * * *